United States Patent [19]

Williams

[11] Patent Number: 5,660,936
[45] Date of Patent: Aug. 26, 1997

[54] FINE GRAIN DIAMOND TOOL AND METHOD OF MANUFACTURE

[75] Inventor: Bradley E. Williams, Worthington, Ohio

[73] Assignee: General Electric Company, Pittsfield, Mass.

[21] Appl. No.: 551,593

[22] Filed: Nov. 1, 1995

[51] Int. Cl.⁶ .................................................. C23C 16/26
[52] U.S. Cl. ............................ 428/408; 407/119; 51/307; 51/309; 428/323; 428/334
[58] Field of Search ................ 51/307, 309; 407/119; 76/DIG. 11; 428/408, 323, 334

[56] References Cited

U.S. PATENT DOCUMENTS

| | | | |
|---|---|---|---|
| 4,151,686 | 5/1979 | Lee et al. .............................. | 51/307 |
| 4,764,434 | 8/1988 | Aronsson et al. ..................... | 428/408 |
| 4,884,476 | 12/1989 | Okuzumi et al. ..................... | 407/118 |
| 4,925,701 | 5/1990 | Jansen et al. ......................... | 427/38 |
| 4,988,121 | 1/1991 | Drawl et al. ......................... | 204/192.3 |
| 5,020,394 | 6/1991 | Nakamura et al. ................... | 76/108.6 |
| 5,082,359 | 1/1992 | Kirkpatrick .......................... | 428/408 |
| 5,124,179 | 6/1992 | Garg et al. ........................... | 427/249 |
| 5,154,245 | 10/1992 | Waldenstrom et al. ............... | 175/420.2 |
| 5,173,089 | 12/1992 | Tanabe et al. . | |

FOREIGN PATENT DOCUMENTS 0 577 066 A1 of 0000 European Pat. Off. .
0 540 366 A1 of 0000 European Pat. Off. .

Primary Examiner—Archene Turner

[57] ABSTRACT

A multi-surfaced diamond tool having at least two surfaces thereof consisting essentially of fine grained diamonds preferably having an average particle size of about 0.01 µm to about 20 µm and a process for preparing the fine grained diamond surfaces by the vapor deposition method. Also included is a diamond tool insert comprising the above diamond tool bonded to a substrate.

8 Claims, 2 Drawing Sheets

FINE GRAIN DIAMOND TOOL AND METHOD OF MANUFACTURE

BACKGROUND OF THE INVENTION

This invention relates to an essentially fine grained diamond tool for polishing, cutting, finishing, metal removal, etc. and to a method of manufacturing the tool. More specifically, this invention is directed to employing the Chemical Vapor Deposition (hereinafter CVD) process for preparing the fine grained diamond tool.

The CVD diamond process has been developed for producing diamond tools for use in various applications. For such applications, a free-standing diamond film is typically lapped to a desired thickness and then polished on one side. The diamond film is then generally cut by laser to a variety of shapes such as triangular, rectangular, trapezoidal, rhumbic, etc. depending on the particular application. The diamond shape is then fixed to a standard substrate such as tungsten carbide or whatever substrate may be used for supporting a diamond tool. While brazing is often a common method of attaching a diamond tool to a substrate, other methods are also applicable such as cementing, clamping or any other known or disclosed methods of so attaching a diamond tool to a substrate. When the diamond tool is so attached to a substrate, the diamond tool is then ground on the cutting edges to produce a finished tool which is referred to as a tool insert. Instead of just the diamond edge of the tool insert being ground, the tool insert may preferably be also ground along the cutting edges.

Diamond materials which are used as tool materials are generally classified into monocrystal and polycrystalline diamond structures. Monocrystal diamond, which is excellent in physical characteristics, has the disadvantages of being expensive and difficult in working into a desired shape as a tool insert and has the problem of cleavage.

Polycrystalline diamond structures for tool applications, however, can be generally divided into two types, namely sintered diamond and vapor-deposited diamond. Sintered diamond is obtained by sintering fine diamond powder and a metal such as cobalt (Co) under diamond stable extra high pressure and high temperature conditions. Such sintering techniques are well described in the patent literature and are well known to those skilled in the art. Commercially available sintered diamonds can be produced in fine particle structure such as 10 um or so and have excellent wear resistance with little or no cleavage being observed. However, sintered diamonds contain as much as about 10% of a binder and as such the cutting edge of such a diamond structure may chip during use as a cutting tool. The effectiveness of the diamond tool, upon losing diamond particles, is reduced and the life of the cutting tool is thereby shortened. Also because of the presence of a binder, the heat resistance of the tool is not as good as the monocrystal diamond structure and the diamond layer will thermally degrade at temperatures greater than 700° C. The abrasion resistance of this tool is also reduced due to the lower hardness of the sintering agent which is present in the diamond layer.

The other type of polycrystalline diamond is the vapor deposited diamond structure which has better wear resistance compared to the sintered diamond. It also has better abrasion resistance due to its dense structure which is formed only of diamond without a binder. The vapor deposited diamond is generally prepared by chemical deposition (CVD) by decomposing and exciting a raw material gas which is mainly composed of hydrocarbon such as methane in the presence of oxygen or hydrogen. The gaseous carbon compound is decomposed and deposits on the surface of a substrate to form diamond. The diamond deposited can either be directly deposited on a cutting tool, or can be deposited on a sacrificial substrate which is removed to form a separate diamond layer. This diamond layer can then be shaped and bonded to a suitable cutting tool substrate. The gas is excited by various means such as by a filament heater, microwave energy, radio frequency energy, direct current energy, or other thermal, electrical, or optical methods. Again, the CVD process is well known to those skilled in the art and is well described in the literature.

Typically, CVD diamond has a columnar microstructure. Thus, at the growth surface of a substrate from which the diamond structure grows, a fine grained diamond film is formed with diamond grain sizes of usually less than 20 µm. Once the film has grown to its final thickness of usually about 400 to about 600 µm, the average grain size on the final growth surface is much larger with grain size of about 75 to about 200 µm. The larger grains have a tendency to fracture more easily than the finer grain sizes. Thus, CVD diamond tools are typically oriented such that the substrate side, i.e., the original growth surface of the fine grained diamond structure is facing the work piece. Even so, the problem of the larger grain diamonds is still present on the sides of the tool since significant flank wear will occur during normal usage of the tool.

SUMMARY OF THE INVENTION

The tool of this invention is a multi-faced fine grained diamond structure tool which is produced by vapor deposition of diamond onto a multi-surface substrate. This is accomplished by providing recesses in the configuration or shape of the finished tool in the substrate. The shaped substrate is placed into the diamond growth reactor to produce a diamond film on the substrate. After the desired growth interval, the diamond film is removed from the substrate by dissolving away the substrate in a solution. Obviously, the diamond film is not affected by the solution. If the substrate has a polished finish, no further finishing is required.

Therefore, it is an object of this invention to provide a multi-surfaced diamond tool having fine grained diamonds on all exposed surfaces.

Another object of this invention is to provide a process for producing a multi-surfaced fine grained diamond tool.

Yet another object of this invention is to provide a tool insert having a fine grained diamond structure on all exposed cutting surfaces thereof.

DETAILED DESCRIPTION OF THE INVENTION

The tool of this invention is a polycrystalline multi-surfaced fine grained diamond tool wherein at least two (2) surfaces thereof consisting essentially of a fine grained diamond structure and, more particularly, at least three (3) surfaces are fine grained diamond surfaces. Preferably, all exposed surfaces of the tool are of a fine grained diamond structure. By exposed surfaces, it is meant that all exposed surfaces when the tool is part of a tool insert. More particularly, the grain size of the surface of the tool has an average diamond particle size of about 0.01 to about 20 µm and more specifically about 1.0 to about 10 µm. The thickness of the tool or diamond film is about 50 to about 1000 µm and preferably about 300 to about 500 µm.

The process of preparing the multi-surface fine grained diamond tool of this invention is by the vapor deposition of a diamond film onto a substrate. Preferably, the deposition method is chemical vapor deposition (CVD) of the diamond film. While there are other methods of vapor deposition of the diamond film, the CVD method is preferred.

The substrate is multi-surfaced so that the surface of the diamond deposited on the surface of the substrate will be a fine grain diamond microstructure. After the desired growth interval, the diamond film is removed from the substrate generally by dissolving the combined diamond film and substrate in a solution that dissolves the substrate, but is inert to the diamond film. If the diamond film has a polished finish, no further finishing is required. A polished finish to the diamond tool can be accomplished if the growth surfaces of the substrate are polished. The substrate can be of any shape depending on the shape of the tool insert. For example, the tool insert may be rectangular, triangular, trapezoidal or whatever shape of the tool insert is wanted.

The tool insert of this invention consists essentially of the diamond tool layer affixed to a substrate. The substrate may be tungsten carbide and it may be cemented, brazed, bonded, etc. However, this invention is not limited to any particular substrate other than the substrate should be suitable for the particular application.

When the diamond layer is affixed to the substrate (tool insert), the larger diamond particle size surface is fixed to the substrate such that the fine grained diamond particle surfaces are exposed to the work piece.

The process of this invention comprises first forming the substrate with recesses to conform to the shape of the diamond tool layer such that when the diamond layer is removed from the substrate, the fine grained diamond microstructure will be exposed. The substrate is placed in a diamond growth reactor. The reactor may be run at about 900° C. and at a pressure of less than altmospheric pressure. A filament heater may be employed to excite the reaction for forming diamond growth on the surfaces of the substrate. The diamond film formed on the surface of the substrate has a fine grained diamond microstructure, having an average size of about 0.01 to about 20 μm and preferably 1.0 to about 10 μm. As the diamond structure grows, the diamond grain particle size increases to a final growth surface of about 75 to about 200 μm.

After the desired time interval for build up of the diamond film, the reaction is stopped and allowed to cool down. When sufficiently cooled, the article is removed from the growth reactor. The substrate is then removed by dissolving in an acid solution that will dissolve the substrate.

After dissolving the substrate, and the diamond layer is removed, washed and dried. If necessary, it may be finished to provide a polished smooth surface. The film may be cut to the desired sizes.

Alternatively, if the substrate has posts (shown in the drawings), the composite may be ground (lapped) until the posts of the substrate are exposed before removing the diamond film from the substrate.

DESCRIPTION OF THE DRAWINGS

In FIG. 1, diamond growth substrate 2 is shown with elevated posts 4, outer side 6 and base 8 of the diamond growth surface.

In FIG. 2, a side view of the diamond growth substrate 2 taken along section A—A' of the top view of FIG. 1 shows elevated posts 4 with base 8 of substrate 2 and diamond growth surfaces 10 of posts 4 and diamond growth surfaces 12 of base 8.

In FIG. 3, the side view of FIG. 2, but with diamond growth on substrate 2, shows diamond growth 14 on surfaces 10 of posts 4 and surfaces 12 of base 8 of substrate 2. In this view, the diamond growth is built up to cover posts 4 and surface 16 is the top surface of diamond growth 14.

In FIG. 4, the side view of FIG. 3 shows substrate 2 with diamond growth 14 on surfaces 10 of posts 4 and surfaces 12 of base 8 having been lapped down to top surface 10 of posts 4.

Figure 1:
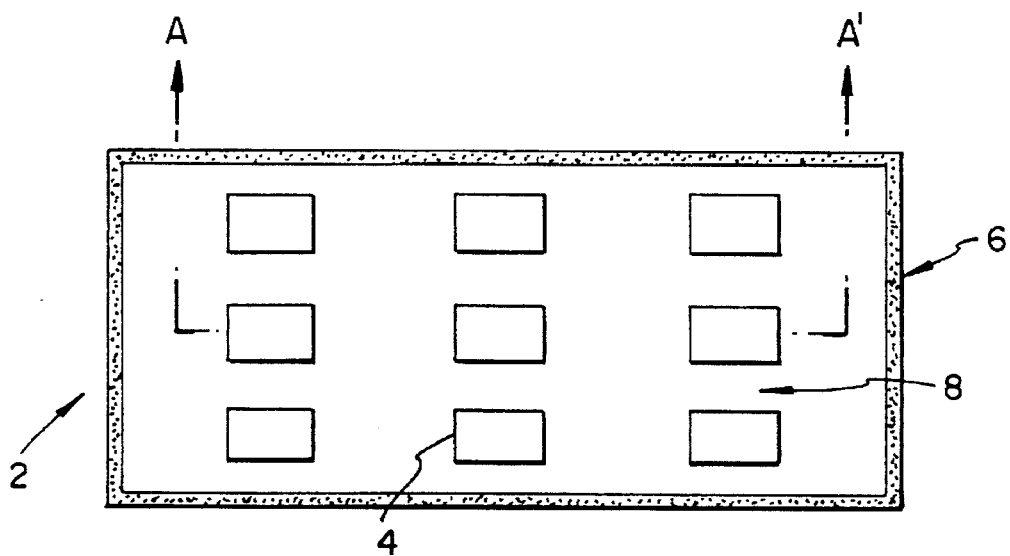
FIG. 1 is a top view of the diamond growth substrate showing in this figure a substrate with substrate posts for providing diamond growth surfaces.
Figure 2:
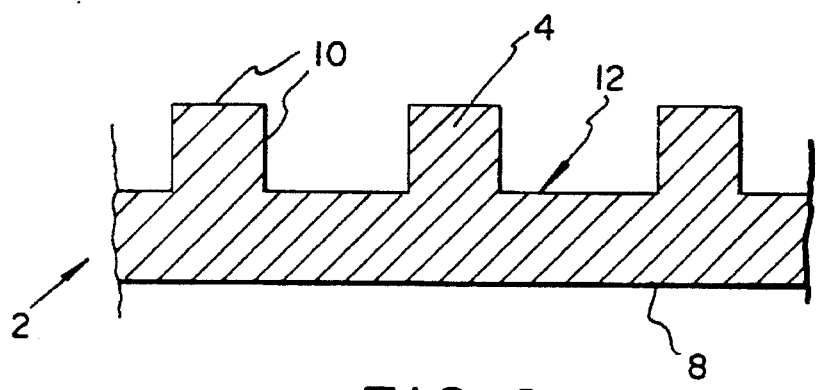
FIG. 2 is a sectional side view of the substrate with substrate posts along section A—A'.

Diamond growth on surfaces 12 of base 8 of substrate 2 and diamond growth on post surfaces 10 (obviously except top surfaces 10 of posts 4 of this embodiment) consists essentially of fine grained microstructure diamonds while diamond growth surfaces 16 (FIG. 3) and 18 (FIG. 4) are of a large grained diamond structure.

Figure 3:
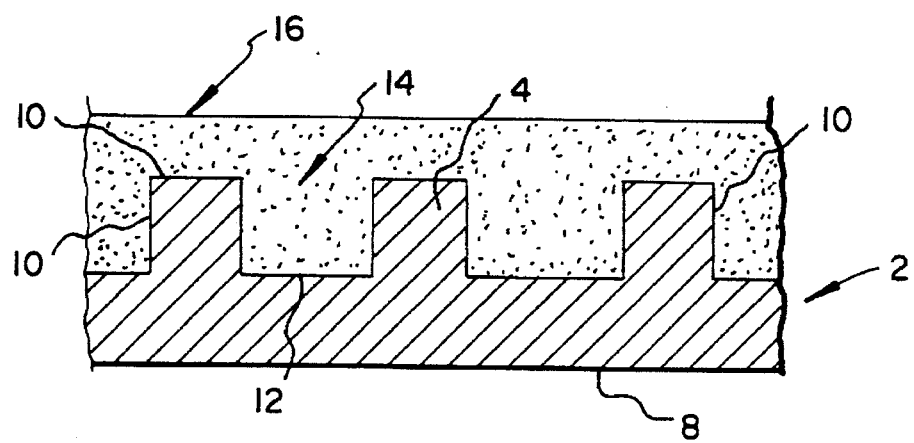
FIG. 3 is a side view of the substrate of FIG. 2 with the diamond growth thereon.
Figure 4:
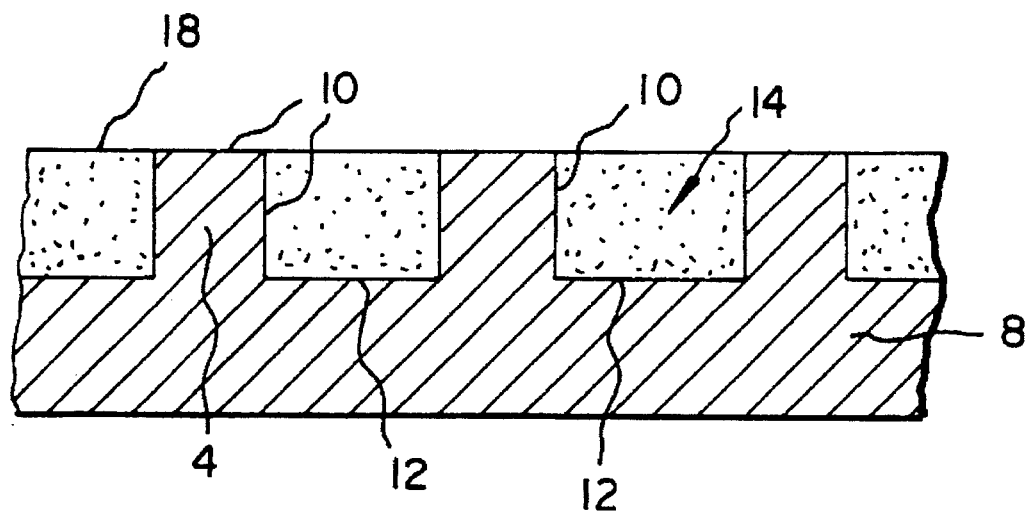
FIG. 4 is the side view of FIG. 3 with the diamond growth lapped down to the top surface of the posts.
Figure 5:
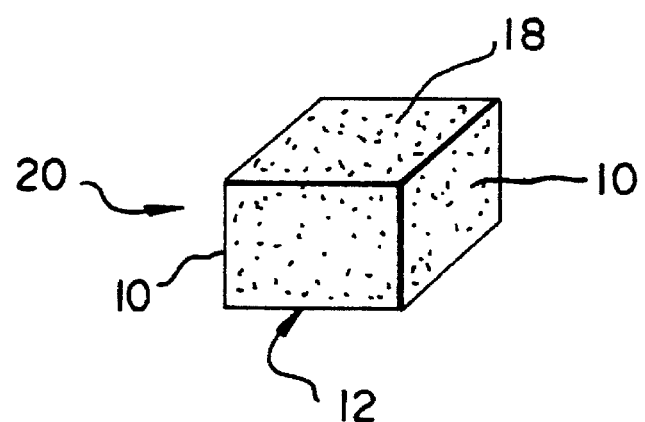
FIG. 5 is a side view of the diamond tool after removal from the substrate. In this view, a single diamond tool is presented after lapping the growth surface until the substrate posts are exposed and the substrate removed.

FIG. 5 is a schematic view of diamond tool 20 after removal of the diamond growth substrate showing a single diamond tool that is obtained from the multi-diamond composite shown in FIGS. 1, 3 and 4 having fine grained microstructure diamond which had been formed on surface 10 of post 4 and surface 12 of base 8 (FIG. 4) and large grained diamond surface 18. For simplicity, diamond surfaces 10 and 12 are kept the same as the surfaces upon which they are formed. Diamond tool 20 is only one segment diamond tool obtained from between two posts of the multi-composite shown in FIGS. 1, 3 and 4.

From one diamond growth substrate with recesses or posts, many individual tools can be obtained whether they are rectangular, triangular, trapezoidal, rhumbic, etc.

In order to obtain a polished or finished surface, the tool may be finished before or after removal of the diamond growth substrate. Alternatively, the diamond tool, after combining with a substrate to form the tool insert, may then be finished. However, the simplest way of obtaining a finished surface is to provide a diamond growth substrate with a polished or finished surface. Then a finishing operation may not be necessary.

After obtaining the diamond tool, it may then be combined with a substrate to form the tool insert. The diamond tool may be brazed, bonded, cemented, etc. to any known variety of substrates such as silicon carbide, tungsten carbide or whatever suitable substrate depending upon the intended application of the tool insert. Such application include, but are not limited to, milling, drilling, cutting, polishing, turning, as well as cutting non-ferrous materials.

The tool insert of this invention comprises a fine grained diamond layer combined with a substrate to form the tool insert. Because of the fine grained microstructure diamond surfaces, the tool insert has more than one exposed surface for use in applications without the need for replacement as a surface becomes worn or chipped from use. This reduces cost, down time and extends the life of the tool insert.

Although the present invention has been described and illustrated in detail, it should be understood that the same is by way of illustration and example only and is not intended to be a limitation on the scope of the present invention as set out by the terms of the appended claims.

What is claimed is:

1. A multi-surfaced polycrystalline diamond tool wherein all exposed diamond surfaces consist essentially of a microstructure of fine grained diamonds.

2. The multi-surfaced polycrystalline diamond tool of claim 1 wherein the average particle size of the diamond grains in each of the diamond surfaces is about 0.01 µm to about 20.0 µm.

3. The multi-surfaced polycrystalline diamond tool of claim 1 wherein the average particle size of the diamond grains in each of the diamond surfaces is about 1.0 µm to about 10 µm.

4. The multi-surfaced polycrystalline diamond tool of claim 1 wherein said diamonds are produced by the vapor deposition process.

5. A diamond tool insert comprising a diamond layer bonded to a surface of a substrate wherein the exposed surfaces of said diamond layer consist essentially of a microstructure of fine grained diamonds.

6. The diamond tool insert of claim 5 wherein the average particle size of the diamonds in said exposed surfaces is about 0.01 µm to about 20 µm.

7. The diamond tool insert of claim 5 wherein the average particles size of the diamonds in said exposed surfaces is about 1.0 µm to about 10 µm.

8. The diamond tool insert of claim 5 wherein the diamond layer has a thickness of about 50 µm to about 1000 µm.

* * * * *